United States Patent
Sugimura et al.

(10) Patent No.: US 10,775,023 B2
(45) Date of Patent: Sep. 15, 2020

(54) WAVELENGTH CONVERSION MEMBER COMPLEX, LIGHT EMITTING DEVICE, AND METHOD FOR MANUFACTURING WAVELENGTH CONVERSION MEMBER COMPLEX

(71) Applicant: NICHIA CORPORATION, Anan-shi, Tokushima (JP)

(72) Inventors: Takuya Sugimura, Tokushima (JP); Naoki Eboshi, Tokushima (JP); Takeshi Ikegami, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/577,202

(22) Filed: Sep. 20, 2019

(65) Prior Publication Data

US 2020/0103095 A1    Apr. 2, 2020

(30) Foreign Application Priority Data

Sep. 27, 2018    (JP) .................................. 2018-181266

(51) Int. Cl.
*F21V 21/00*    (2006.01)
*F21V 9/30*    (2018.01)
(Continued)

(52) U.S. Cl.
CPC ................ *F21V 9/30* (2018.02); *B32B 3/266* (2013.01); *B32B 7/12* (2013.01); *B32B 18/00* (2013.01);
(Continued)

(58) Field of Classification Search
CPC .......... F21V 9/30; F21V 29/502; F21V 29/70; F21V 29/86; B32B 3/266; B32B 7/12;
(Continued)

(56) References Cited

U.S. PATENT DOCUMENTS 10,670,200 B2 *    6/2020    Noguchi ............ C09K 11/7706
2014/0085923 A1    3/2014    Nakazato
(Continued)

FOREIGN PATENT DOCUMENTS

JP    2013-074273 A    4/2013
JP    2014-067961 A    4/2014
(Continued)

*Primary Examiner* — Laura K Tso
(74) *Attorney, Agent, or Firm* — Global IP Counselors, LLP (57) ABSTRACT

A wavelength conversion member complex includes a wavelength conversion member, a joining material, and a heat dissipation member. The wavelength conversion member includes a support and a phosphor member. The support defines a through-hole extending from an upper surface to a lower surface. The support has a concave portion on the lower surface around the through-hole. The concave portion is spaced apart from the through-hole. The phosphor member is disposed in the through-hole and includes a phosphor. The lower surface of the phosphor member is continuous with the lower surface of the support. The joining material is disposed in the concave portion, and has a lower surface that is flush with the lower surface of the support. The heat dissipation member is disposed under the joining material and the phosphor member, and has an upper surface in contact with the lower surface of the joining material.

15 Claims, 6 Drawing Sheets

(51) Int. Cl.
*H01L 33/48* (2010.01)
*F21V 29/502* (2015.01)
*F21V 29/85* (2015.01)
*F21V 29/70* (2015.01)
*B32B 7/12* (2006.01)
*B32B 3/26* (2006.01)
*B32B 18/00* (2006.01)
*B32B 37/12* (2006.01)
*B32B 37/18* (2006.01)
*B32B 38/00* (2006.01)
*H01L 33/50* (2010.01)
*F21Y 115/30* (2016.01)

(52) U.S. Cl.
CPC .............. *B32B 37/12* (2013.01); *B32B 37/18* (2013.01); *B32B 38/0008* (2013.01); *F21V 29/502* (2015.01); *F21V 29/70* (2015.01); *F21V 29/86* (2015.01); *H01L 33/483* (2013.01); *H01L 33/507* (2013.01); *B32B 2307/302* (2013.01); *B32B 2307/42* (2013.01); *B32B 2307/422* (2013.01); *B32B 2310/0843* (2013.01); *B32B 2315/02* (2013.01); *B32B 2457/00* (2013.01); *F21Y 2115/30* (2016.08)

(58) Field of Classification Search
CPC ......... B32B 18/00; B32B 37/12; B32B 37/18; B32B 38/0008; B32B 2307/302; B32B 2307/42; B32B 2307/422; B32B 2310/0843; B32B 2315/02; B32B 2457/00; H01L 33/483; H01L 33/507; F21Y 2115/30

USPC .......................................................... 362/84
See application file for complete search history.

(56) References Cited

U.S. PATENT DOCUMENTS

| | | | |
|---|---|---|---|
| 2015/0118772 A1* | 4/2015 | Chen | ..................... H01L 33/505 438/27 |
| 2015/0346594 A1 | 12/2015 | Shimizu et al. | |
| 2016/0091171 A1 | 3/2016 | Okada | |
| 2016/0195244 A1* | 7/2016 | Harada | ................... F21S 41/16 362/84 |
| 2017/0122505 A1 | 5/2017 | Kiyota et al. | |
| 2017/0241621 A1* | 8/2017 | Yamada | ............. C09K 11/7774 |
| 2018/0087726 A1* | 3/2018 | Yamashita | ............. H01S 5/005 |
| 2018/0149954 A1 | 5/2018 | Akiyama | |
| 2019/0081452 A1* | 3/2019 | Miura | ..................... H01S 5/005 |

FOREIGN PATENT DOCUMENTS

| | | |
|---|---|---|
| JP | 2015-230322 A | 12/2015 |
| JP | 2016-072513 A | 5/2016 |
| JP | 2017-054785 A | 3/2017 |
| JP | 2017-085036 A | 5/2017 |
| JP | 2017-149929 A | 8/2017 |
| JP | 2018-054900 A | 4/2018 |
| JP | 2018-088307 A | 6/2018 |

* cited by examiner

WAVELENGTH CONVERSION MEMBER COMPLEX, LIGHT EMITTING DEVICE, AND METHOD FOR MANUFACTURING WAVELENGTH CONVERSION MEMBER COMPLEX

CROSS-REFERENCE TO RELATED APPLICATION

This application claims priority to Japanese Patent Application No. 2018-181266 filed on Sep. 27, 2018, the disclosure of which is hereby incorporated herein by reference in its entirety.

BACKGROUND

The present disclosure relates to a wavelength conversion member complex, a light emitting device, and a method for manufacturing a wavelength conversion member complex.

There are conventional light emitting devices that make use of semiconductor laser elements. With such a light emitting device, a structure has been proposed in which a heat dissipation member is joined to a wavelength conversion member having a phosphor layer that is irradiated with laser light. The phosphor layer and the heat dissipation member are joined together, for example, by forming a plurality of concave portions are formed in either the phosphor layer or the heat dissipation member, and filling in the concave portions with an adhesive agent (for example, JP2017-54785A).

SUMMARY

However, when concave portions are formed in the phosphor layer in order to join the heat dissipation member and the wavelength conversion member, there is a risk that the strength of the phosphor layer may be compromised, etc. On the other hand, when concave portions are formed in the heat dissipation member, there is a risk that the work may be more complicated than when the concave portioned portions are formed in the wavelength conversion member, which can drive up the cost. Also, when an adhesive is disposed between the phosphor layer and the heat dissipation member, there is the risk that heat dissipation may be diminished by the adhesive, and that light output may be reduced.

Accordingly, the present disclosure is to provide a wavelength conversion member complex that can efficiently dissipate to the heat dissipation member the heat generated by the phosphor member when the phosphor member is irradiated with excitation light, as well as a light emitting device equipped with this wavelength conversion member complex, and a method for manufacturing a wavelength conversion member complex.

The present disclosure includes the following aspects.

A wavelength conversion member complex includes a wavelength conversion member, a joining material, and a heat dissipation member. The wavelength conversion member includes a support and a phosphor member. The support defines a through-hole extending from an upper surface to a lower surface. The support has a concave portion on the lower surface around the through-hole. The concave portion is spaced apart from the through-hole. The phosphor member is disposed in the through-hole and includes a phosphor. The lower surface of the phosphor member is continuous with the lower surface of the support. The joining material is disposed in the concave portion, and has a lower surface that is flush with the lower surface of the support. The heat dissipation member is disposed under the joining material and the phosphor member, and has an upper surface in contact with the lower surface of the joining material.

A light emitting device includes the wavelength conversion member complex of the above, and a light emitting element configured to irradiate the phosphor member of the wavelength conversion member complex with excitation light.

A method for manufacturing a wavelength conversion member complex includes: providing a wavelength conversion member including a support defining one or more through-holes extending from an upper surface to a lower surface, the support having a concave portion on the lower surface around each of the one or more through-holes, the concave portion being spaced apart from each of the one or more through-holes, and a phosphor member disposed in each of the one or more through-holes and including a phosphor, a lower surface of the phosphor member being continuous with the lower surface of the support; placing a joining material in the concave portion; and joining the heat dissipation member to the wavelength conversion member to obtain a joined member in which the heat dissipation member is disposed under the joining material and the phosphor member, by bringing a lower surface of the joining material into contact with an upper surface of a heat dissipation member.

With this wavelength conversion member complex and its method of manufacture, because the joining material is provided to the support of the wavelength conversion member, it is possible to join the wavelength conversion member and the heat dissipation member without interposing a joining material between the phosphor member and the heat dissipation member. Therefore, the heat generated by the phosphor member when the phosphor member is irradiated with excitation light can be efficiently dissipated to the heat dissipation member.

Also, this wavelength conversion member complex makes it possible to obtain a highly reliable light emitting device with good heat dissipation.

DETAILED DESCRIPTION

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

Embodiment 1: Wavelength Conversion Member Complex 10

Figure 1A:
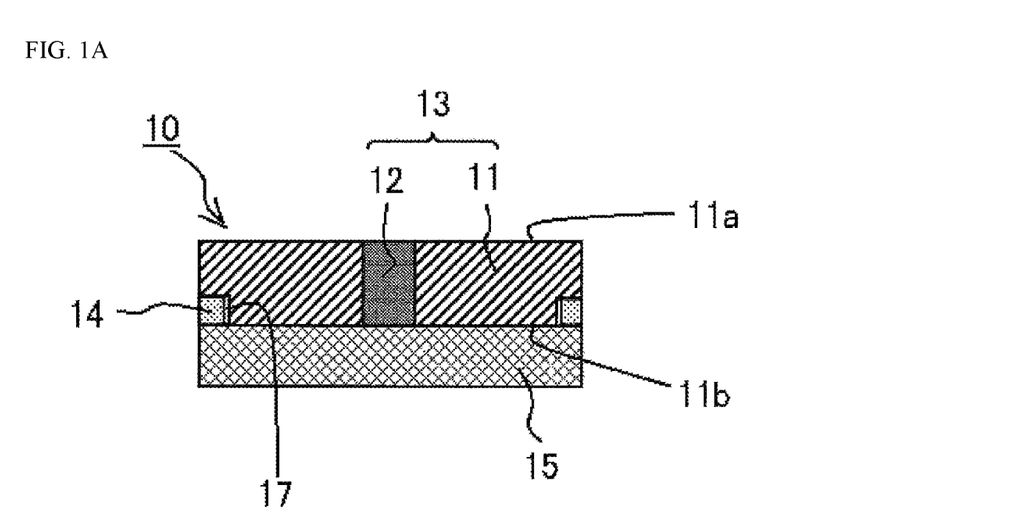
FIG. 1A is a cross-sectional view schematically showing a wavelength conversion member complex according to an embodiment of the present disclosure.
Figure 1B:
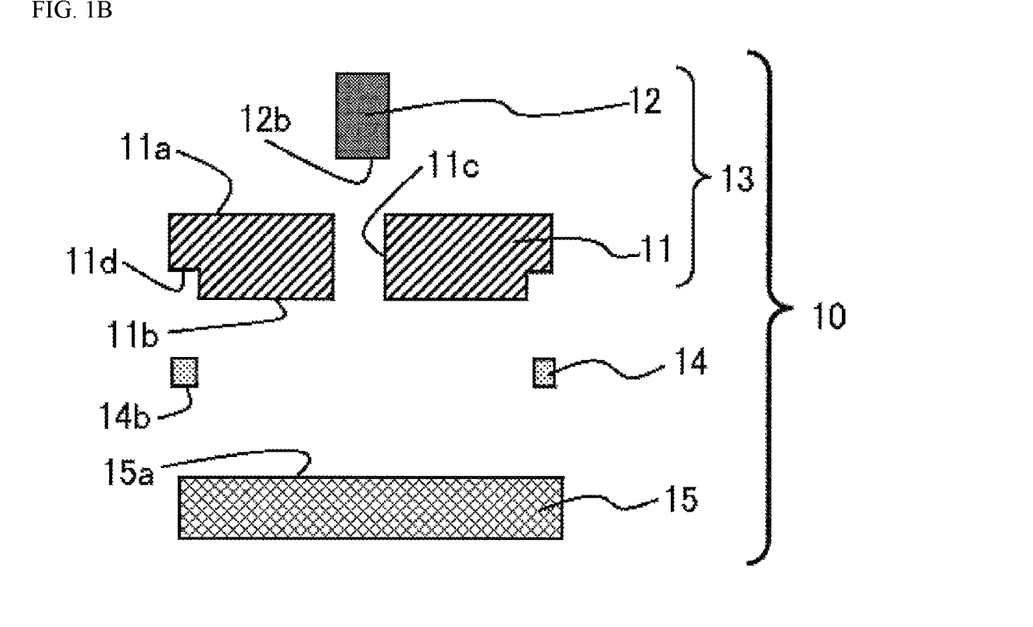
FIG. 1B is an exploded cross-sectional view schematically showing the wavelength conversion member complex shown in FIG. 1A.
Figure 1C:
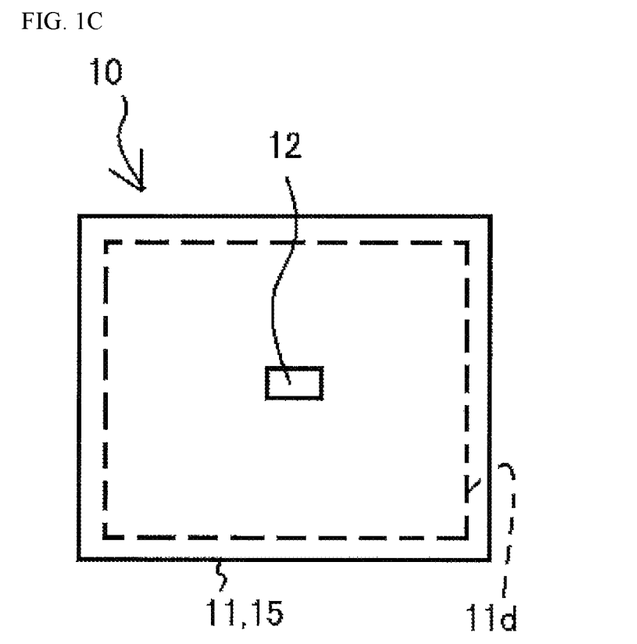
FIG. 1C is a plan view schematically showing the wavelength conversion member complex shown in FIG. 1A.

As shown in FIGS. 1A to 1C, the wavelength conversion member complex 10 in this embodiment has a wavelength conversion member 13 that includes a support 11 and a phosphor member 12, a joining material 14, and a heat dissipation member 15. As shown in FIGS. 1A and 1B, the support 11 has a through-hole 11c extending from the upper surface 11a to the lower surface 11b, and has on the lower surface 11b a concave portion 11d provided away from the through-hole 11c and around the through-hole 11c. The wavelength conversion member 13 includes a phosphor, and the lower surface 12b thereof is continuous with the lower surface 11b of the support 11 and is disposed in the through-hole 11c. The joining material 14 is embedded or placed in the concave portion 11d of the support 11 and has a lower surface 14b that is flush with the lower surface 11b of the support 11. The heat dissipation member 15 is disposed below the wavelength conversion member 13, that is, below the support 11, the joining material 14, and the phosphor member 12, and has an upper surface 15a that comes into contact with the lower surface 14b of the joining material 14. In this Specification, the side of the wavelength conversion member complex 10 on which light is incident shall be referred to as the lower surface, and the side from which light is taken off shall be referred to as the upper surface.

With this wavelength conversion member complex 10, the joining material 14 is provided not to the phosphor member 12, but to the support 11 constituting the wavelength conversion member 13. Therefore, the wavelength conversion member 13 and the heat dissipation member 15 can be joined without interposing the joining material 14 between the phosphor member 12 and the heat dissipation member 15. Consequently, the heat generated by the phosphor member 12 when the phosphor member 12 is irradiated with light can be dissipated to the heat radiating member 15 without passing through the joining material 14, so efficient heat dissipation can be anticipated. Also, since the light emitted by the phosphor member 12 does not directly irradiate the joining material 14, absorption of light by the joining material 14 can be reduced, so the decrease in light emission efficiency can be suppressed. Also, since the joining material 14 is not directly irradiated with light, deterioration of the joining material 14 can be suppressed, making it less likely that the wavelength conversion member will separate from the heat dissipation member. As a result, it is possible to obtain a wavelength conversion member 13 with high reliability.

Wavelength Conversion Member 13

The wavelength conversion member 13 is made up of the support 11 and the phosphor member 12, as mentioned above.

Support 11

The support 11 may be any member that constitutes a wavelength conversion member and can hold a phosphor member, and preferably has suitable strength.

Examples of the material that makes up the support body 11 include metal, ceramic, resin, glass, or a composite material provided with one or more of these. Among these, when the influence of the heat generation of the phosphor member 12 is taken into account, a material that is resistant to heat is preferable, and a material having a small difference in thermal expansion coefficient from that of the phosphor member 12 is also preferable. Also, since the light emitting surface of the wavelength conversion member complex 10 is the surface of the phosphor member 12, the surface of the support 11 on the phosphor member 12 side is preferably made of a light reflective material. This allows the light in the phosphor member 12 to be reflected by the support 11, and it is possible to prevent the light from reaching the joining material 14. Therefore, this suppress the decrease in light emission efficiency attributable to the absorption of light by the joining material 14.

The support 11 can be formed mainly from aluminum oxide, aluminum nitride, silicon nitride, silicon carbide, and other such ceramics, for example. Also, a light reflective material may be obtained by adding a material having a refractive index higher than that of the main component (such as aluminum oxide) as an additive to these materials. The material having a high refractive index may, for example, have a refractive index of 1.8 or more, and is preferably 2.0 or more. The difference in the refractive index from that of the main component is, for example, 0.4 or more, and may be 0.7 or more. The additive can be used in an amount of 30 wt % or less of the material constituting the support. In addition, a light reflective material can be obtained by adding a material with a different refractive index to the main material, so the material with a high refractive index is not limited to titanium oxide and other such additives, and may also be a gas such as air. That is, a space filled with a gas such as air may be employed instead of an additive.

The support 11 may have any shape that can hold the phosphor member. An example of the shape of the support 11 is a plate-like member whose surface is flat, and one that has upper and lower surfaces parallel to each other, for example. Having parallel upper and lower surfaces facilitates attachment to the other members constituting the wavelength conversion member complex 10, facilitates attachment to a light emitting device, etc., and can improve the accuracy of light takeoff and so forth. Also, the planar shape of the support 11 can be suitably set as dictated by the shape of the light emitting device to be applied, etc., and various shapes can be used, such as circular, elliptical, or a polygonal shape such as quadrangular.

It is preferable for the upper surface 11a and the lower surface 11b of the support 11, and particularly the lower surface 11b, to be flat. This is to ensure proper joining with the joining material 14 (discussed below).

For the sake of strength, the thickness of the support 11 is, for example, 0.2 mm or more. In order to suppress the increase in cost and in height, the thickness of the support 11 is preferably no more than 2.0 mm.

The support 11 has a through-hole 11c extending from its upper surface 11a to its lower surface 11b. The through-hole 11c is what holds the phosphor member 12, and may have the same cross sectional shape from the upper surface 11a to the lower surface 11b, or may have a shape that expands or contracts toward the upper surface, toward the lower surface, toward the upper and lower surfaces, or toward the center. A variety of shapes are possible for the through-hole 11c in top view, such as a circular shape, an elliptical shape, or a polygonal shape such as quadrangular, or a combination of these shapes. The shape and size of the through-hole 11c can be, for example, a shape and size that can accommodate substantially all of the light from the light emitting element 41. When the light to be subjected to wavelength conversion is a laser beam, the opening of the through-hole 11c can be such that one side or the diameter is 100 μm or more and 3000 μm or less, for example. It is easier to manufacture the opening of the through-hole 11c if one side or the diameter is 200 μm or more. Also, the opening of the through-hole 11c can have a size of 0.01 mm$^2$ or more.

Figure 2A:
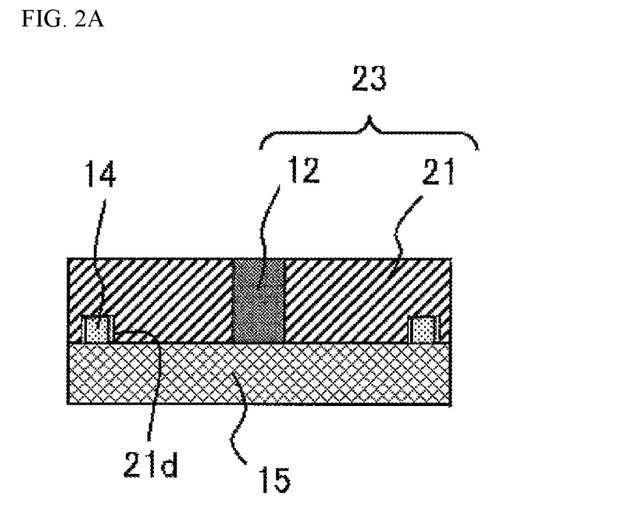
FIG. 2A is a cross-sectional view schematically showing a modified embodiment of the wavelength conversion member complex shown in FIG. 1A.
Figure 2B:
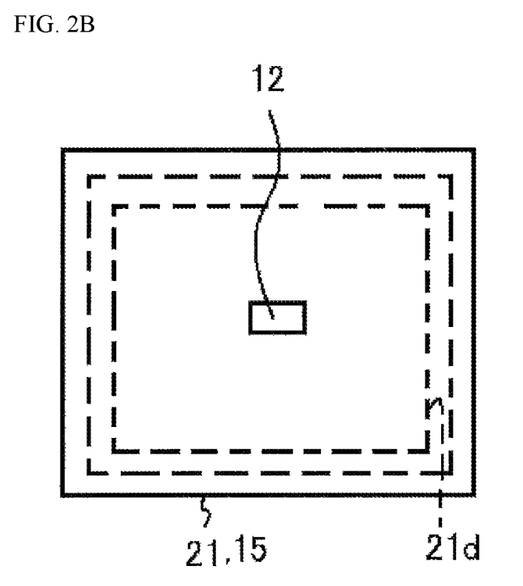
FIG. 2B is a plan view schematically showing the wavelength conversion member complex shown in FIG. 2A.
Figure 2C:
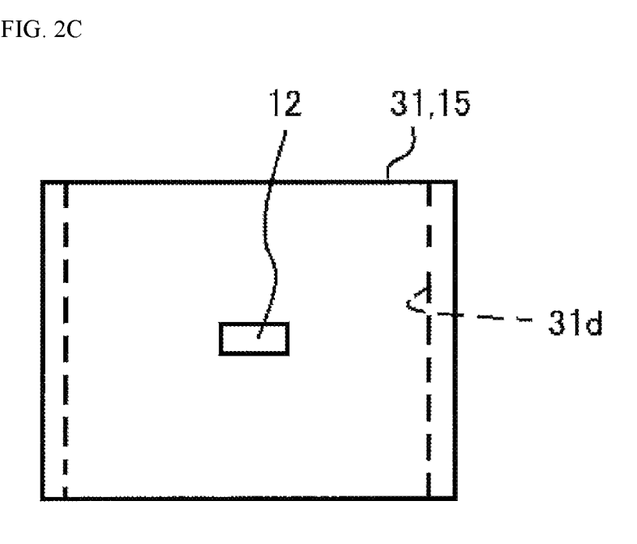
FIG. 2C is a cross-sectional view schematically showing another modified embodiment of the wavelength conversion member complex shown in FIG. 1A.

In plan view, the support 11 has a concave portion 11d disposed on the lower surface 11b so as to be away from the through-hole 11c and around the through-hole 11c. The phrase "around the through-hole" here means both the structure in which the concave portion 11d extends all the way around the through hole 11c (see FIG. 1) and the structure in which the concave portion 11d is arranged only in a portion or portions around the through-hole 11c (see FIG. 2C). It is preferable that the concave portion 11d extends all the way around the through-hole 11c (see FIG. 1C). That is, it is preferable for the concave portion 11d to have a shape that is connected all the way around the through-hole 11c. This allows the support 11 to be joined more securely to the heat dissipation member 15. The concave portion 11d may be disposed only part of the way around the through-hole 11c (see the concave portion 31d of the support 31 in FIG. 2C). In this case, two or more concave portions 11d may be disposed around the through-hole 11c. Also, as long as the concave portion 11d is away from the through-hole 11c, the distance by which the concave portion 11d is separated from the outer periphery of the through-hole 11c may be the same in all the way around the through-hole 11c, or it may be different in places. The separation distance may be, for example, at least twice the diameter or maximum width at the upper surface of the through-hole 11c, and may be three or four times or more, may be ten times or less, and preferably eight times or less. As discussed below, thus separating the concave portion 11d from the through-hole 11c also separates the joining material 14 from the phosphor member 12, and this can prevent deterioration of the joining material 14 that would otherwise be caused by the heat produced by irradiation of the phosphor member 12 with light. The concave portion 11d may be away from the outer edge of the support 11 (see the concave portion 21d of the support 21 in FIGS. 2A and 2B), but is preferably disposed in a shape that includes the outer edge. Consequently, even if the size of the support 11 itself is small, its separation distance from the through-hole 11c can be further increased.

The depth of the concave portion 11d is, for example, from 3 μm to 1350 μm, and preferably 10 μm to 400 μm. In other words, the depth of the concave portion 11d is preferably from 0.5% to 75% of the thickness of the support 11. Setting the depth to this range facilitates the supply of the proper quantity of the joining material 14 (discussed below). The width of the concave portion 11d can be 200 μm or more. As discussed below, when cutting at the position of the concave portion 11d, the width of the concave portion 11d before cutting is preferably 500 μm or more in consideration of the width of the dicer or the like used for this cutting. When a resin sheet is used as the joining material 14, working becomes more difficult as the width decreases, so a width of at least 1 mm is preferable. Also, the width of the concave portion 11d can be 4.5 mm or less. Setting the width of the concave portion 11d somewhat larger makes it easier for the joining material 14 to spread out inside the concave portion 11d, and can prevent the generation of voids in the joining material 14. On the other hand, narrowing the width of the concave portion 11d ensures enough contact surface area of the support 11 and the phosphor member 12 to the heat dissipation member 15, so the heat dissipation effect can be further improved. If the concave portion 11d is provided only part of the way around the through-hole, the length of one concave portion may be equal to or greater than the width of the concave portion 11d, and can be equal to or less than the longest part of the support. Setting the range in this way will prevent the joining material 14 from leaking out of the concave portion onto the lower surface 11b of the support 11 even if there is some extra joining material (discussed below). The depth and width of the concave portion 11d may be the same all the way around, or may be different in places.

The concave portion 11d can be formed by a known method in this field. Examples included a method in which polishing is performed only in the through direction of the concave portion using abrasive grains of about the same size as the width of the concave portion, as well as sand blasting, pattern formation by etching, cutting, laser working, and so on.

If the support 11 is made of ceramics, the through-hole and the concave portion can be easily formed in the desired shapes and sizes by molding an unfired material such as a green sheet.

Phosphor Member 12

The phosphor member 12 contains a phosphor. Also, the phosphor member 12 is disposed in the through-hole 11c. In this case, the phosphor member 12 is preferably disposed inside the through-hole 11c in contact with the entire inner wall of the through-hole 11c. This allows the heat generated by the phosphor member 12 to be efficiently dissipated to the support 11. The lower surface of the phosphor member 12 may protrude beyond the lower surface 11b of the support 11, or may be recessed, but is preferably flush with the lower surface 11b of the support 11. Consequently, when the heat dissipation member 15 (discussed below) is joined to the lower surface of the wavelength conversion member, both the support 11 and the phosphor member 12 can be in contact with the heat dissipation member 15 and this close contact affords more efficient dissipation of heat. The upper surface of the phosphor member 12 is preferably flush with the upper surface of the support 11, but may be slightly recessed or protruding. The lower surface of the phosphor member 12 is continuous with the lower surface 11b of the support 11. Here, saying that these surfaces are continuous is not limited to a state in which they are strictly in the same plane, and there may be a height difference of about 30 μm or less. The smaller is the height difference, the better will be both heat dissipation and adhesion, so the height difference between them is preferably 10 μm or less.

The lower surface 12b of the phosphor member 12 is preferably flat. The purpose of this is to better ensure the proper contact surface area with the heat dissipation member (discussed below).

The phosphor member 12 is preferably composed of a ceramic material containing a phosphor or a single crystal of a phosphor. For example, when a ceramic is used for the phosphor member 12, it can be obtained by sintering a phosphor material and a light transmissive material such as aluminum oxide ($Al_2O_3$, melting point: about 1900° C. to 2100° C.). An example of the phosphor content is from 0.05 vol % to 50 vol % with respect to the total volume of the ceramic. Also, a ceramic substantially composed of only a phosphor may be formed by sintering a powder of the phosphor, without using a light transmissive material. A configuration such as this affords better heat resistance than with a member made of a resin containing a phosphor, so it can be used for laser beam irradiation over a relatively long period.

The phosphor contained in the fluorescent member 12 may be any phosphor known in the art. For example, cerium-activated yttrium aluminum garnet (YAG), cerium-activated lutetium aluminum garnet (LAG), europium and/or chromium-activated nitrogen-containing calcium aluminosilicate ($CaO-Al_2O_3-SiO_2$), and europium-activated silicate ($(Sr, Ba)_2SiO_4$), α-SiAlON phosphor, β-SiAlON phosphor. KSF phosphor and the like. Among them, it is preferable to use a YAG phosphor which is a phosphor having good heat resistance.

The phosphor member 12 is disposed in the through-hole 11c of the support 11, but its shape and its manufacturing method may conform to any known method, such as the methods disclosed in JP 2014-67961A and JP 2017-149929A.

Joining Material 14

The joining material 14 can be embedded in the concave portion 11d and have a lower surface that is flush with the lower surface 11b of the support 11. The joining material 14 may have a side surface that can be flush with the side surface of the support 11, or may have a side surface that is not flush with the side surface of the support. In the former case, the side surface of the joining material 14 is preferably flush with the side surface of the support 11 that is on the opposite side from the phosphor member 12, that is, the outer side surface. Also, the other side of the joining material 14 may be flush with the side of the concave portion 11d that is near the phosphor member 12, that is, the inner side surface of the concave portion 11d, but as shown in FIG. 1A, it may not be in contact with the inner side surface, and may have an air gap 17. When such an air gap 17 is present, the generation of excess joining material can be reliably avoided, and leakage or penetration of the joining material 14 to the lower surface 11b of the support 11 can be prevented. Also, even if the heat of the wavelength conversion member complex causes expansion or contraction, the joining material 14 can be kept inside the concave portion, so leakage or penetration of the joining material 14 to the lower surface 11b of the support 11 can be prevented. As a result, the heat of the support 11 can be efficiently and directly dissipated to the heat dissipation member.

Examples of the joining material 14 include silicone resin, epoxy resin, acrylic resin, and other such organic adhesives, solder, braze, and other such low-melting point metal joining materials, and low-melting point glass. Of these, an organic adhesive is preferable because it allows for adhesion at a relatively low temperature and because the manufacturing cost is low, and deterioration of the phosphor material during bonding is prevented, among other reasons. Of these organic adhesives, those having a viscosity before bonding of 1 Pa·s or more are preferable, with 80 Pa·s or more being even better. If the organic adhesive has such a viscosity, it will not spread out too much within the concave portion 11d, so it can maintain a shape that protrudes out of the concave portion 11d, and can be more securely bonded to the heat dissipation member 15. An example of the viscosity of the organic adhesive is 500 Pa's or less. The joining material 14 is preferably in the form of a resin sheet, for example. If it is a resin sheet, it can be disposed in an appropriate size at the appropriate position. This can reduce the likelihood that a surplus portion of the joining material 14 will be generated, and also can reduce the likelihood that a void will be generated in the joining material 14.

The amount in which the joining material 14 is supplied can be suitably adjusted according to the size of the concave portion 11d in the wavelength conversion member 13 being used. As mentioned above, it is preferable to supply it in a volume less than the total volume of the concave portion.

Heat Dissipation Member 15

The heat dissipation member 15 is disposed below the wavelength conversion member 13 and the joining material 14, that is, the support 11, the phosphor member 12, and the joining material 14. Also, the heat dissipation member 15 has an upper surface 15a in contact with the lower surface of the joining material 14. The wavelength conversion member 13 can be joined to the heat dissipation member 15 by the joining material 14. More preferably, the upper surface 15a of the heat dissipation member 15 is in contact with the lower surface 11b of the support 11 and the lower surface 12b of the phosphor member 12. Such contact allows the heat of the phosphor member 12 and the support 11 to be dissipated directly and efficiently to the heat dissipation member.

The heat dissipation member 15 may be composed of a material having a thermal conductivity better than that of the material constituting the support 11. The heat dissipation member 15 is composed of a light transmissive material, for example. The term "light transmissive" here means that the material can transmit the light that irradiates the wavelength conversion member complex 10, and examples include a material having a light transmittance of 70% or more, 80% or more, or 90% or more. When the heat dissipation member 15 is formed from a light transmissive material, it is possible to emit the excitation light from the heat dissipation member side. Also, although the surface of the phosphor member that is irradiated with light tends to generate the most heat, in this case the heat dissipation member can be brought into contact with the light irradiated surface, so heat can be dissipated more efficiently. When an opaque material is used as the heat dissipation member 15, excitation light may be emitted from above the phosphor member 12. Examples of the material constituting the heat dissipation member 15 include a sinter, a single crystal, or the like of an oxide or a nitride, or a metal material. As the metal material, aluminum or the like can be used on account of its high thermal conductivity, high reflectance to visible light, and suppression of absorption of fluorescent light and excitation light to suppress the decrease in emission efficiency. Also, silver or the like may be used to increase the reflectance of the heat dissipation member. An insulating material such as AlN having a low thermal expansion coefficient and a high thermal conductivity may be used. In this case, a coating of a metal material such as silver may be used to increase the reflectance of the surface. Sapphire is an example of a single crystal. For example, sapphire may be used as the light transmissive heat dissipation member 15.

The heat dissipation member 15 can have the same shape and size as the outside of the upper surface 11a of the support 11 in top view, but may be slightly larger or smaller. It is preferable for the upper surface 11a of the heat dissipation member 15 to be flat. The reason for this is to ensure good joining between the heat dissipation member 15 and the joining material 14 and to ensure the proper contact surface area between the support 11 and the phosphor member 12. The thickness of the heat dissipation member 15 is, for example, 0.1 mm to 5 mm, and preferably 0.3 mm to 1 mm. This ensures adequate strength of the heat dissipation member 15, and can improve heat dissipation.

Embodiment 2: Light Emitting Device

Figure 3A:
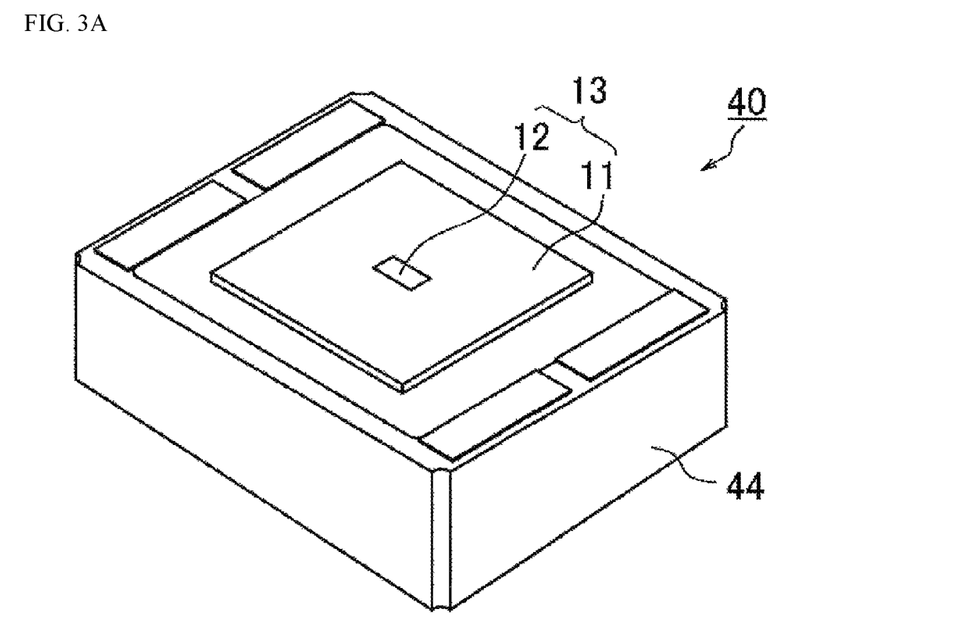
FIG. 3A is an oblique view schematically showing a light emitting device according to an embodiment of the present disclosure.
Figure 3B:
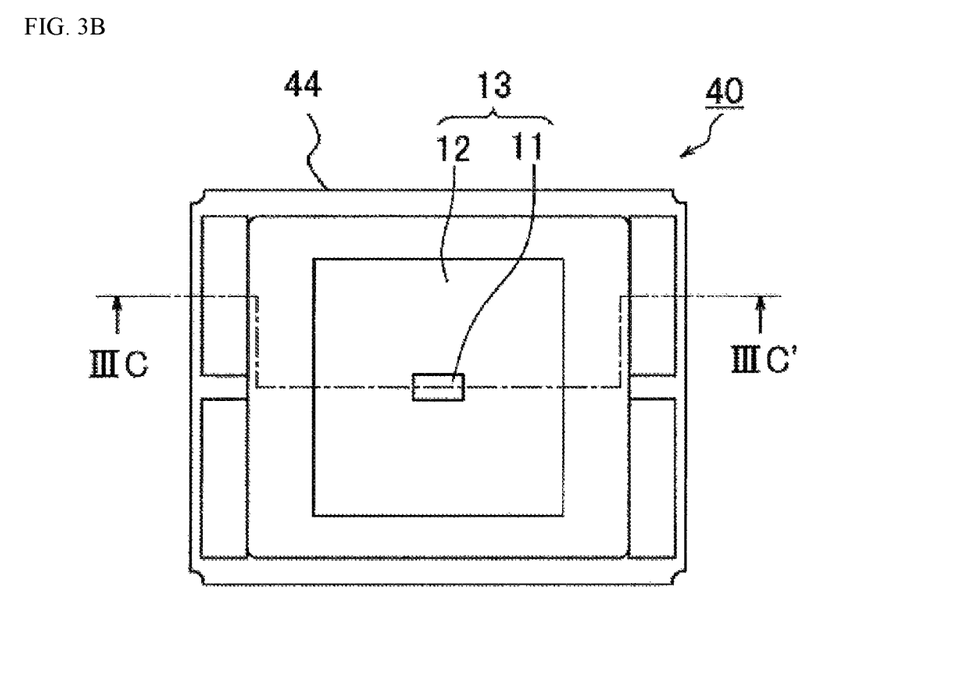
FIG. 3B is a plan view schematically showing the light emitting device shown in FIG. 3A.
Figure 3C:
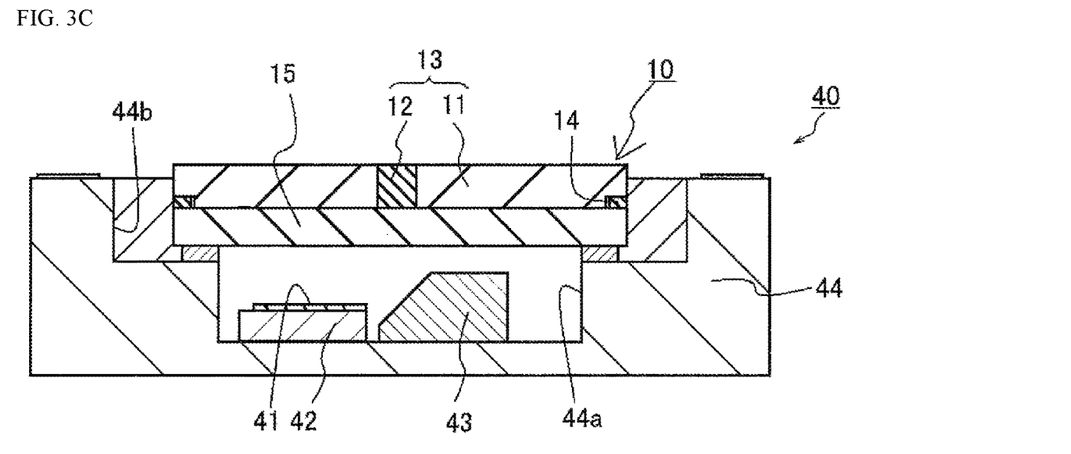
FIG. 3C is a cross-sectional view schematically showing a light emitting device taken along line IIIC-IIIC' in FIG. 3D.

As shown in FIGS. 3A to 3C, the light emitting device 40 in this embodiment includes the wavelength conversion member complex 10 described above and a light emitting element 41 for irradiating the phosphor member 12 of the wavelength conversion member complex 10 with excitation light. The wavelength conversion member complex 10 and the light emitting element 41 are usually housed or mounted in a package 44 that constitutes the light emitting device 40.

Package 44

The package 44 has a concave portion 44a whose upper surface side is open in order to accommodate the light emitting element 41. The wavelength conversion member complex 10 is disposed so as to cover the top of the concave portion 44a. The package 44 can have a wall 44b that defines a surface area larger than the planar shape of the concave portion 44a, at a position away from the wavelength conversion member complex 10. The package 44 can be formed mainly from aluminum oxide, aluminum nitride, silicon nitride, silicon carbide, or another such ceramic, or copper or another such metal. The package 44 can have any of various shapes, such as a square shape in top view, for example. An electrode or the like for supplying current to the light emitting element 41 is disposed on the bottom surface, the wall 44b, and/or the upper surface of the concave portion 44a of the package 44.

The wavelength conversion member complex 10 is fixed by a metal joining layer, for example, between the concave portion 44a and the wall 44b. Examples of the metal joining layer include solders such as Sn—Bi, Sn—Cu, and Sn—Ag, alloys containing Au and Sn as main components, alloys containing Au and Si as main components, alloys containing Au and Ge as main components, and another eutectic alloys, brazing materials having a low melting point, and adhesives combining these.

Light Emitting Element 41

Examples of the light emitting element 41 include a light emitting diode (LED) and a semiconductor laser element, with a semiconductor laser element being preferable. When a semiconductor laser element is used, the surface area of the light incident surface of the phosphor member 12 can be made smaller than when using an LED, so the surface area of the lower surface 11b of the support 11 can be relatively increased. The advantage to this is that it is easy to provide the concave portion 11d in which the joining material 14 is disposed. The light emitting element 41 is disposed in a space surrounded by the package 44 and the wavelength conversion member complex 10. The light emitting element 41 may be disposed directly on the bottom surface of the concave portion 44a of the package 44, but may be disposed on a submount 42 as shown in FIG. 3C. The light emitting element 41 shown in FIG. 3C is a semiconductor laser element, and is mounted such that the emitted laser beam travels in a direction substantially parallel to the bottom surface of the package 44.

Examples of the submount 42 include those formed from SiC, AlN, or the like as the main material. The mounting of the light emitting element 41 on the submount 42 can be performed using an AuSn eutectic solder or the like, for example.

As shown in FIG. 3C, the light emitting element 41 is disposed so that the end surface from which the laser light is emitted is opposite the inclined surface of a reflecting member 43 disposed in the concave portion 44a of the package 44. Consequently, the laser beam emitted from the light emitting element 41 irradiates the reflecting member 43, and the reflecting member 43 reflects it in the direction of the wavelength conversion member complex 10, which is fixed on the upper surface side of the package 44, allowing the phosphor member 12 of the wavelength conversion member complex 10 to be irradiated with excitation light.

For example, the reflecting member 43 can be a member in which a reflective film is provided to an inclined surface of a main body composed of glass, silicon, or the like in the form of a triangular prism, or a quadrangular frustum, or the like. The angle of the inclined surface with respect to the bottom surface of the main body is preferably about 45 degrees in order to guide the laser light in a direction perpendicular to the bottom surface of the package 44. The reflective film can be a single-layer or multi-layer dielectric film or metal film. In FIG. 3C, the direction in which the laser beam is emitted by the light emitting element 41 is to the right in the drawing, the light emitting element 41 may be disposed to emit the laser beam upward in the drawing, in which case there is no need for the reflecting member 43.

Embodiment 3: Method for Manufacturing Wavelength Conversion Member Complex

Figure 4A:
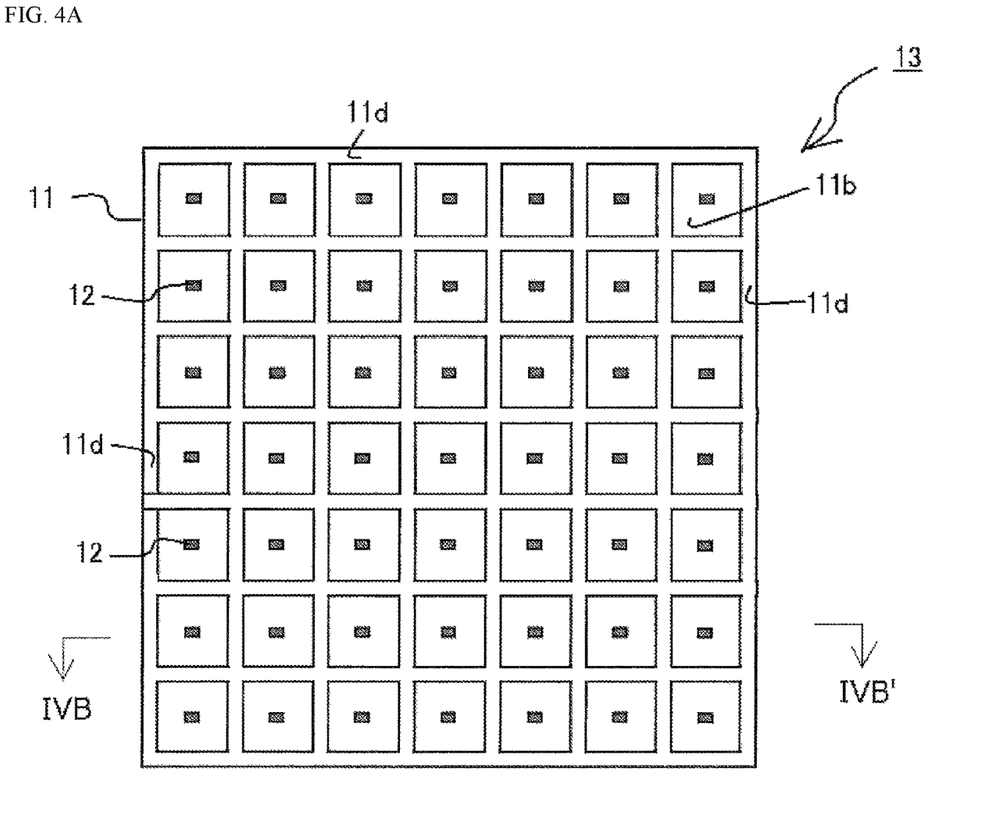
FIG. 4A is a plan view schematically showing the method for manufacturing the wavelength conversion member complex shown in FIG. 1A.
Figure 4B:
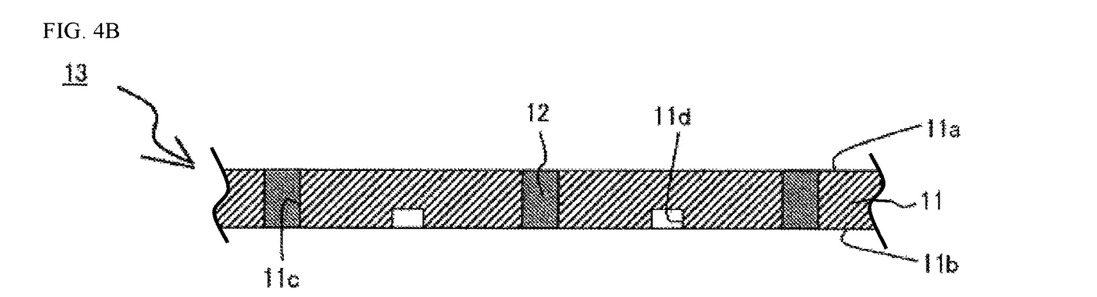
FIG. 4B is a partial cross-sectional view schematically showing the method for manufacturing the wavelength conversion member complex shown in FIG. 1A.
Figure 4C:
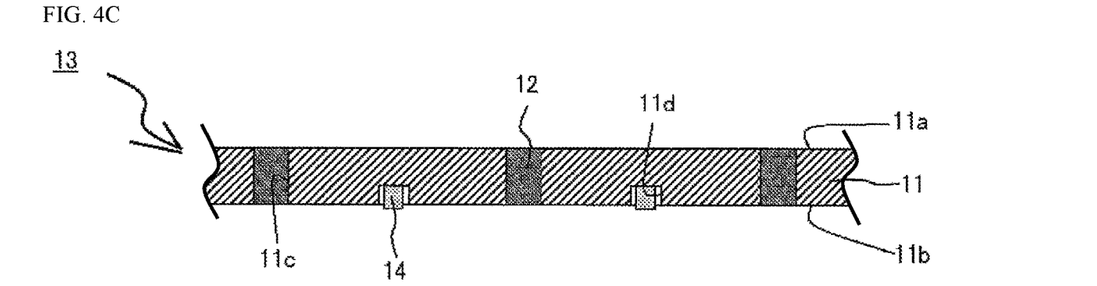
FIG. 4C is a partial cross-sectional view schematically showing the method for manufacturing the wavelength conversion member complex shown in FIG. 1A.
Figure 4D:
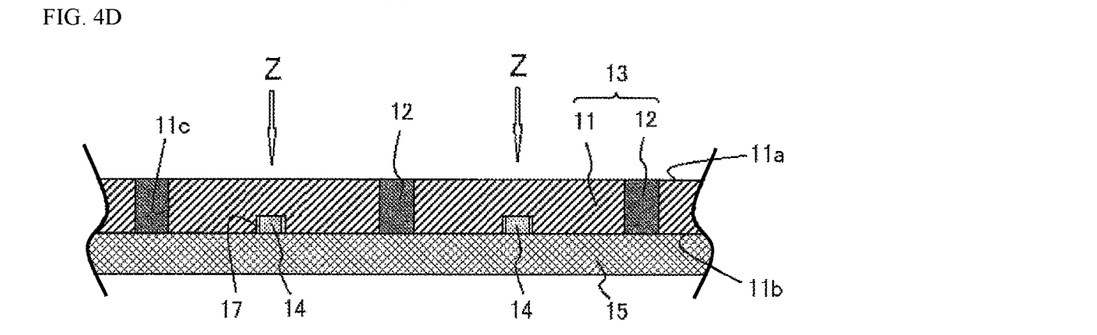
FIG. 4D is a partial cross-sectional view schematically showing the method for manufacturing the wavelength conversion member complex shown in FIG. 1A.

The method for manufacturing a wavelength conversion member complex in this embodiment includes the following steps. As shown in FIGS. 4A and 4B, a wavelength conversion member 13 is prepared that includes a support 11 having one or more through-holes 11c extending from the upper surface 11a to the lower surface 11b and a concave portion 11d provided on the lower surface 11b around each of the one or more through-holes 11c and away from each of the one or more through-holes 11c; and a phosphor member 12 that is disposed in each of the one or more through-holes 11c. Next, as shown in FIG. 4C, a joining material 14 is embedded in the concave portion, and as shown in FIG. 4D, a heat dissipation member 15 is brought into contact with the lower surface of the joining material 14 and joined under the joining material 14 and the phosphor member 12.

With this method for manufacturing a wavelength conversion member complex, a wavelength conversion member complex may be manufactured by joining one heat dissipation member corresponding to a wavelength conversion member having one phosphor member, or there may be a step of joining a single heat dissipation member to a wavelength conversion member having a plurality of phosphor members, and dividing up the product (the joined member) of joining the wavelength conversion member and the heat dissipation member for each individual phosphor member or for a plurality of phosphor members.

Since the joining material can be provided to the support with this method for manufacturing the wavelength conversion member complex 10, the wavelength conversion member and the heat dissipation member can be simply and easily joined without interposing a joining material between the phosphor member and the heat dissipation member. Consequently, a wavelength conversion member complex that can efficiently dissipate the heat generated by the phosphor member when the phosphor member is irradiated with excitation light can be reliably manufactured with high accuracy.

Preparation of Wavelength Conversion Member 13

First, the wavelength conversion member 13 is prepared as shown in FIGS. 4A and 4B.

The wavelength conversion member is obtained by providing a flat plate of the material constituting the support 11, forming a plurality of through-holes in a grid or in a row in the flat plate, and disposing a concave portion in a grid shape around each of the through-holes. This allows the concave portion to be disposed around each of the plurality of through-holes. Either the formation of the through-holes or the formation of the concave portion may be performed first, or they may be formed at the same time, depending on the manufacturing method. The through-holes and the concave portions here can be formed punching, dicing, etching, sand blasting, polishing, or another such method that is known in the art. If the support 11 is formed from a ceramic, the shape of the green sheet and so forth may be formed using a die or the like to form the through-holes and/or concave portions before or during sintering, or the through-holes and/or concave portions may be formed before or during sintering by molding the material constituting the support.

It is preferable for the phosphor member 12, which contains a phosphor and whose lower surface is continuous with the lower surface of the support, to be disposed in the through-hole of the support 11.

The wavelength conversion member 13 can be formed by sintering the product of integrally molding the material of a powdered support 11 and a phosphor member 12 composed of a sinter or other such molded body, or the material of a powdered phosphor member 12 and a support 11 composed of a molded body. The molded body can be molded by slip casting, a doctor blade method (sheet molding), a dry molding method, or the like. The sintering can entail spark plasma sintering (SPS), hot press sintering (HPS), or the like. As an example of these methods, the methods described in JP2017-149929A can be used. Also, CIP (cold isostatic pressing), HIP (hot isostatic pressing), or the like can be used to manufacture the phosphor member 12.

Specific examples for manufacturing the wavelength conversion member 13 will be given below.

(1) A manufacturing method including the steps of providing a phosphor member that includes a phosphor and in which a plurality of convex portions are provided on the front side, providing a powdered light reflecting member, and disposing the powdered light reflecting member between the plurality of convex portions in the phosphor member, a step of sintering these to obtain a sinter in which the phosphor member and the light reflecting member are integrally formed; and a step of removing part of the sinter from the front side and/or the rear side of the phosphor member. A slurry containing a powdered light reflecting member may be used in place of the powdered light reflecting member.

(2) A manufacturing method including the steps of providing a light reflecting member in which a plurality of concave portions are provided on the front side, providing a powdered phosphor member containing a phosphor, and disposing the powdered phosphor member in the plurality of concave portions in the light reflecting member; a step of sintering these to obtain a sinter in which the light reflecting member and the phosphor member are integrally formed; and a step of removing part of the sinter from at least the rear side of the light reflecting member.

(3) A manufacturing method including the steps of providing a light reflecting member provided with a plurality of through-holes passing through the first main surface and the second main surface that are on opposite sides from each other, providing a powdered phosphor member containing a phosphor, and disposing the powdered phosphor member in the through-holes; a step of sintering these to obtain a sinter in which the light reflecting member and the phosphor member are integrally formed; and a step of removing part of the sinter from front side and/or the rear side of the phosphor member.

Here, the term "sinter" means the product of integrally sintering the phosphor member and the support. Sintering can be performed within a temperature range of 1100° C. to 1800° C. After obtaining the sinter, it may be heat treated within a temperature range of 1000° C. to 1500° C. in an oxidizing atmosphere. When a sinter containing an oxide is formed using a sintering mold containing carbon, the reflectance of the sinter may decrease on account of the carbon, in which case the sinter can be heat treated in an oxidizing atmosphere to improve its reflectance. Examples of the method for removing part of the sinter include grinding, polishing, and chemical mechanical polishing.

FIGS. 4A and 4B show an assembly for forming a plurality of wavelength conversion member complexes. To form a single wavelength conversion member complex, a flat plate of the material constituting the support 11 is prepared, one through-hole is formed in this plate, and one or more concave portions are formed so as to surround this through-hole. Also, as described above, a ceramic material may be sintered to form a phosphor member and a support that surrounds it, and one or more concave portions may be formed in the support.

Placing of Joining Material 14

As shown in FIG. 4C, the joining material 14 is embedded in the concave portion 11$d$ of the support 11 of the wavelength conversion member 13. Any material known in this field can be used as the joining material 14, but it is preferable to use the joining material 14 in a volume smaller than the volume of the concave portion 11$d$ when it is embedded in the concave portion 11$d$. More specifically, it is preferable to use a sheet that is thicker than the depth of the concave portion 11$d$ and narrower than the width of the concave portion 11$d$. Using a joining material in this form reduces the generation of voids in the joining material as compared to when using a liquid joining member. This allows the wavelength conversion member 13 to be more securely joined to the heat dissipation member (discussed below), and can prevent any excess joining material 14 from oozing out of the concave portion 11d at the time of joining. Also, the gap between the lower surface of the wavelength conversion member 13 and the upper surface of the heat dissipation member 15 can be reduced, which can suppress the decrease in heat dissipation.

Joining of Heat Dissipation Member 15

The heat dissipation member 15 is joined to the wavelength conversion member 13 as shown in FIG. 4D. The heat dissipation member 15 is joined by bringing the heat dissipation member 15 into contact with the lower surface of the joining material 14 in the concave portion 11d, so that the heat dissipation member 15 is joined under the joining material 14 and the phosphor member 12. It is particularly favorable to bring the lower surface 11b of the support 11 and the lower surface 12b of the phosphor member 12 into contact with the upper surface of the heat dissipation member 15, and join the heat dissipation member 15 and the wavelength conversion member 13 with the joining material 14. Consequently, the entire lower surface 11b of the support 11 and the entire lower surface 12b of the phosphor member 12 can be brought into contact with the heat dissipation member, and heat can be efficiently dissipated. The side surface of the joining material 14 need not be in complete contact with the inner side surface of the concave portion 11d, and there may be a gap 17 as shown in FIG. 4D.

When the wavelength conversion member 13 has a plurality of phosphor members 12 in a row or column, and has a plurality of concave portions 11d disposed in a row or column between the phosphor members 12, a single heat dissipation member 15 may be joined to a plurality of phosphor members 12, or a plurality of heat dissipation members 15 may be joined to each phosphor member 12.

Division

As described above, when one heat radiating member 15 is joined to a wavelength conversion member 13 having a plurality of phosphor members 12, it is preferable, for example, if the joined member including the wavelength conversion member 13 and the heat dissipation member 15 are divided up at the sites indicated by the arrows Z in FIG. 4D around the individual phosphor member 12 in each of the through-holes 11c, or around each of groups including a plurality of phosphor members respectively arranged in the through-holes 11c. This makes it possible to obtain a wavelength conversion member complex of the desired size in which the support 11 is disposed around the phosphor member 12.

This division may be accomplished by any method known in this field, such as scribing or dicing, for example. The division is performed, for example, at sites joined by the joining material 14, so that there is no gap into which cutting dust or the like can penetrate if such dust is generated, and this can prevent cutting dust or the like from getting into the gap between the wavelength conversion member and the heat dissipation member. Consequently, peeling of the wavelength conversion member and the heat dissipation member can be prevented even better.

The division includes dicing from the top surface of the support 11 down to at least the joining material 14. In case where a resin is used as the joining material 14, for example, the joining material 14 can be divided by dicing. Since division is preferably performed using the position of the phosphor member 12 as a reference, it is preferable to dice while observing from the side where the phosphor member 12 is on the surface. In particular, in case where using laser scribing, it is preferable to carry out laser irradiation from the support side. The observation for positioning of the laser scribing is performed from the side irradiated with the scribing laser. Furthermore, in case where sapphire is used as the heat dissipation member, division is preferably performed by dicing from the upper surface of the support down through a portion of the heat dissipation member in the thickness direction, and setting the focal point within the sapphire and performing laser scribing. Since sapphire is difficult to dice, laser scribing can be used to divide more accurately.

What is claimed is:

1. A wavelength conversion member complex comprising:
   a wavelength conversion member including
      a support defining a through-hole extending from an upper surface to a lower surface, the support having a concave portion on the lower surface around the through-hole, the concave portion being spaced apart from the through-hole, and
      a phosphor member disposed in the through-hole and including a phosphor, a lower surface of the phosphor member being continuous with the lower surface of the support;
   a joining material disposed in the concave portion, and having a lower surface that is flush with the lower surface of the support; and
   a heat dissipation member disposed under the joining material and the phosphor member, and having an upper surface in contact with the lower surface of the joining material.

2. The wavelength conversion member complex according to claim 1, wherein
   the joining material has a side surface that is flush with a side surface of the support.

3. The wavelength conversion member complex according to claim 1, wherein
   the support is made of a light reflective material.

4. The wavelength conversion member complex according to claim 1, wherein
   the support is made of a ceramic material.

5. The wavelength conversion member complex according to claim 1, wherein
   the phosphor member is made of a ceramic material containing the phosphor or a single crystal of the phosphor.

6. The wavelength conversion member complex according to claim 1, wherein
   the heat dissipation member is made of a light transmissive material.

7. The wavelength conversion member complex according to claim 1, wherein
   the heat dissipation member is made of sapphire.

8. A light emitting device comprising:
   the wavelength conversion member complex of claim 1; and
   a light emitting element configured to irradiate the phosphor member of the wavelength conversion member complex with excitation light.

9. The light emitting device according to claim 8, wherein the light emitting element is a semiconductor laser element.

10. A method for manufacturing a wavelength conversion member complex comprising:
   providing a wavelength conversion member including
      a support defining one or more through-holes extending from an upper surface to a lower surface, the support having a concave portion on the lower surface around each of the one or more through-holes, the concave portion being spaced apart from each of the one or more through-holes, and
      a phosphor member disposed in each of the one or more through-holes and including a phosphor, a lower surface of the phosphor member being continuous with the lower surface of the support;
   placing a joining material in the concave portion; and
   joining the heat dissipation member to the wavelength conversion member to obtain a joined member in which the heat dissipation member is disposed under the joining material and the phosphor member, by bringing a lower surface of the joining material into contact with an upper surface of a heat dissipation member.

11. The method for manufacturing a wavelength conversion member complex according to claim 10, wherein
   the placing of the joining material includes placing the joining material having a shape of a sheet that is thicker than a depth of the concave portion and narrower than a width of the concave portion.

12. The method for manufacturing a wavelength conversion member complex according to claim 10, wherein
   the providing of the wavelength conversion member includes providing the wavelength conversion member having a plurality of the through-holes in a grid or in a row, and at least one concave portion disposed around a corresponding one of the through-holes, and
   after the joining of the heat dissipation member to the wavelength conversion member, dividing the joined member at the concave portion around one of the through-holes or around a group including a plurality of the through-holes.

13. The method for manufacturing a wavelength conversion member complex according to claim 12, wherein
   the dividing of the joined member includes dicing from the top surface of the support down to at least the joining material.

14. The method for manufacturing a wavelength conversion member complex according to claim 13, wherein
   the heat dissipation member is made of sapphire, and
   the dividing of the joined member includes dicing from the upper surface of the support down through a portion of the heat dissipation member in a thickness direction by setting a focal point within the sapphire and performing laser scribing.

15. The method for manufacturing a wavelength conversion member complex according to claim 14, wherein
   the performing of the laser scribing includes irradiating laser from a support side.

* * * * *